(12) United States Patent  
Nakashima et al.

(10) Patent No.: US 10,312,227 B2  
(45) Date of Patent: Jun. 4, 2019

(54) POWER SEMICONDUCTOR MODULE

(71) Applicant: MITSUBISHI ELECTRIC CORPORATION, Chiyoda-ku, Tokyo (JP)

(72) Inventors: Yukio Nakashima, Tokyo (JP); Takeshi Tanaka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/068,934

(22) PCT Filed: Feb. 18, 2016

(86) PCT No.: PCT/JP2016/054749  
§ 371 (c)(1),  
(2) Date: Jul. 10, 2018

(87) PCT Pub. No.: WO2017/141407  
PCT Pub. Date: Aug. 24, 2017

(65) Prior Publication Data  
US 2019/0019785 A1 Jan. 17, 2019

(51) Int. Cl.  
*H01L 25/18* (2006.01)  
*H01L 23/055* (2006.01)  
(Continued)

(52) U.S. Cl.  
CPC ............ *H01L 25/18* (2013.01); *H01L 23/055* (2013.01); *H01L 23/28* (2013.01); *H01L 25/07* (2013.01);  
(Continued)

(58) Field of Classification Search  
CPC ....... H01L 25/07; H01L 25/18; H01L 23/055; H01L 23/28; H02M 5/4585; H02M 7/003;  
(Continued)

(56) References Cited

U.S. PATENT DOCUMENTS

| | | | | |
|---|---|---|---|---|
| 2010/0039843 A1* | 2/2010 | Takizawa | ............ | H02M 7/487 363/131 |
| 2011/0222325 A1* | 9/2011 | Komatsu | ............ | H02M 7/487 363/127 |
| 2013/0063067 A1 | 3/2013 | Tanaka | | |

FOREIGN PATENT DOCUMENTS

JP 4902029 B1 3/2012

OTHER PUBLICATIONS

International Search Report (PCT/ISA/210) dated May 10, 2016, by the Japanese Patent Office as the International Searching Authority for International Application No. PCT/JP2016/054749.  
(Continued)

*Primary Examiner* — Peniel M Gumedzoe  
(74) *Attorney, Agent, or Firm* — Buchanan Ingersoll & Rooney PC

(57) ABSTRACT

First and second element pairs formed by connecting FWDs and MOSFETs in antiparallel are connected in series and sealed by resin to configure a core module. In the core module, a first drain electrode, a first source electrode, a second drain electrode, and a second source electrode are exposed to the surface. A cover with terminals is put on the core module. At this time, each of the direct-current positive electrode terminal, the direct-current negative electrode terminal, and the alternating-current terminal of the cover with terminals is electrically connected to each of the first drain electrode, the second source electrode, and the first source electrode and the second drain electrode.

15 Claims, 12 Drawing Sheets

(51) Int. Cl.
  *H02M 7/5387* (2007.01)
  *H02M 7/00* (2006.01)
  *H01L 23/28* (2006.01)
  *H01L 25/07* (2006.01)
  *H02M 5/458* (2006.01)
  *H02M 3/158* (2006.01)
  *H02P 27/08* (2006.01)

(52) U.S. Cl.
  CPC ......... *H02M 5/4585* (2013.01); *H02M 7/003* (2013.01); *H02M 7/5387* (2013.01); *H02M 7/53871* (2013.01); *H02M 3/158* (2013.01); *H02P 27/08* (2013.01)

(58) Field of Classification Search
  CPC ........... H02M 7/5387; H02M 7/53871; H02M 3/158; H02P 27/08
  See application file for complete search history.

(56) References Cited

OTHER PUBLICATIONS

Written Opinion (PCT/ISA/237) dated May 10, 2016, by the Japanese Patent Office as the International Searching Authority for International Application No. PCT/JP2016/054749.

\* cited by examiner

FIG.4A
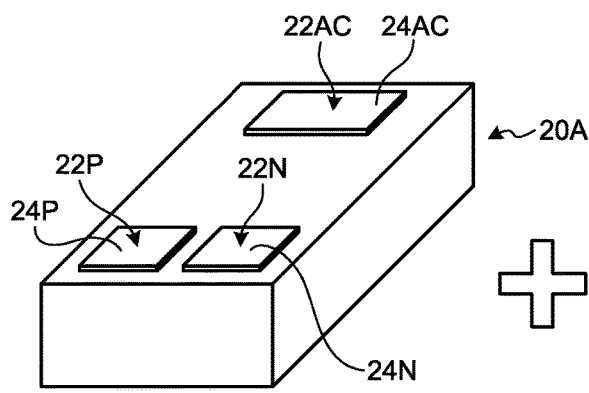
FIG.4B
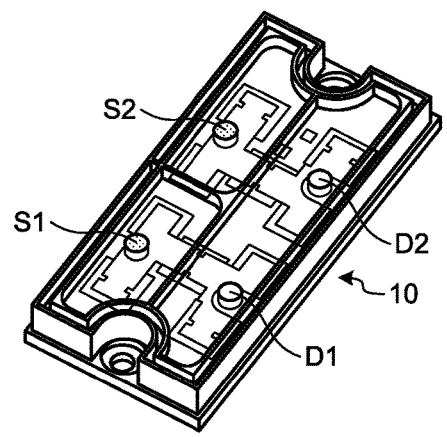
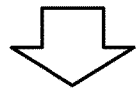
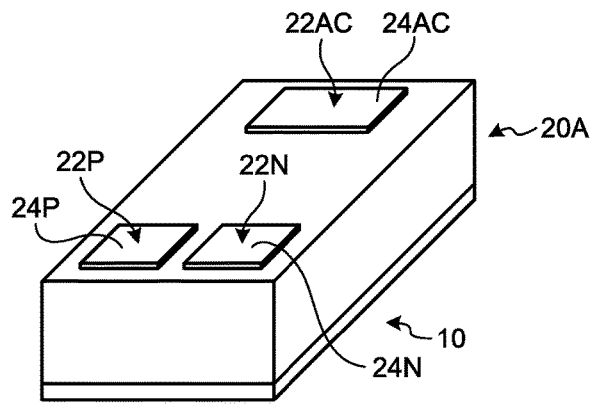
FIG.4C

POWER SEMICONDUCTOR MODULE

FIELD

The present invention relates to a power semiconductor module suitably used in a power device apparatus.

BACKGROUND

Patent Literature 1 described below discloses a power semiconductor module for a railroad vehicle use including a first element pair formed by connecting a diode element and a MOS-type switching element in antiparallel, the first element pair operating as a positive-side arm in a power converting apparatus, and a second element pair formed by connecting a diode element and a MOS-type switching element in antiparallel, the second element pair operating as a negative-side arm in the power converting apparatus. The first and second element pairs are housed in one module and configured as a 2-in-1 module. The power semiconductor module includes an external electrode terminal that enables series connection of the first and second element pairs.

CITATION LIST

Patent Literature

Patent Literature 1: Japanese Patent No. 4902029

SUMMARY

Technical Problem

The related art described above discloses a circuit example in changing a connection form of a power semiconductor module mounted with a MOSFET or an IGBT connected in series to be easily driven and applying the power semiconductor module to power converting apparatuses for railroad vehicles having different overhead wire voltages. However, the related art does not directly disclose the configuration of the power semiconductor module itself. Therefore, in the related art, in application to various power converting apparatuses for railroad vehicles, a circuit configuration obtained by combining a plurality of power semiconductor modules is necessary. There is room of improvement in terms of versatility.

The present invention has been devised in view of the above, and an object of the present invention is to provide a power semiconductor module having versatility in application to various power converting apparatuses for railroad vehicles.

Solution to Problem

To solve the problems and achieve the object, a power semiconductor module according to the present invention includes: a core module in which a first element pair formed by connecting a diode element and a switching element in antiparallel and a second element pair formed by connecting a diode element and a switching element in antiparallel are connected in series and the first element pair and the second element pair are sealed by resin; and a cover with terminals including a direct-current positive electrode terminal, a direct-current negative electrode terminal, and an alternating-current terminal. In the core module, a first electrode electrically connected to a positive-side electrode of the switching element configuring the first element pair, a second electrode electrically connected to a negative-side electrode of the switching element configuring the first element pair, a third electrode electrically connected to a positive-side electrode of the switching element configuring the second element pair, and a fourth electrode electrically connected to a negative-side electrode of the switching element configuring the second element pair are exposed to a surface. The positive electrode terminal of the cover with terminals is electrically connected to the first electrode. The negative-electrode terminal of the cover with terminals is electrically connected to the fourth electrode. The alternating-current terminal of the cover with terminals is electrically connected to the second electrode and the third electrode.

Advantageous Effects of Invention

According to the present invention, there is an effect that it is possible to provide a power semiconductor module of high withstanding voltage specifications that has versatility and can obtain a mass production effect.

BRIEF DESCRIPTION OF DRAWINGS

FIGS. 4A to 4C are exploded perspective views illustrating the exterior configuration of a 500A-rated one-phase module, which is an example of the power semiconductor module according to the first embodiment.

DESCRIPTION OF EMBODIMENTS

Power semiconductor modules according to embodiments of the present invention are explained in detail below with reference to the drawings. Note that the present invention is not limited by the embodiments explained below.

First Embodiment

Figure 1:
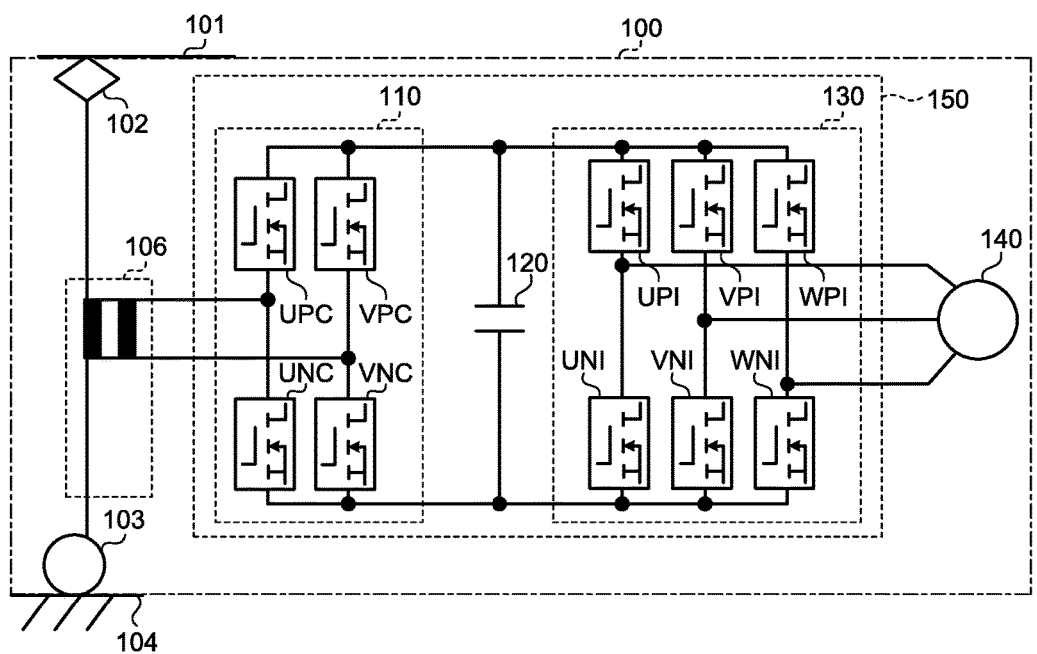
FIG. 1 is a diagram illustrating a schematic functional configuration of a power converting apparatus mounted with a power semiconductor module according to an embodiment.

FIG. 1 is a diagram illustrating a schematic functional configuration of a power converting apparatus mounted with a power semiconductor module according to a first embodiment. A configuration example of a power converting apparatus 150 mounted on a railroad vehicle 100 is illustrated. As illustrated in FIG. 1, the power converting apparatus 150 includes a converter 110, a capacitor 120, and an inverter 130. The railroad vehicle 100 is mounted with a transformer 106 disposed on an input end side of the power converting apparatus 150 and connected to the converter 110 and an electric motor 140 disposed on an output end side of the power converting apparatus 150, connected to the inverter 130, and configured to receive power supply from the power converting apparatus 150 to drive the vehicle. Note that, as the electric motor 140, an induction electric motor or a synchronous electric motor is suitable.

One end of a primary winding of the transformer 106 is connected to an overhead wire 101 via a power collecting device 102. The other end of the transformer 106 is connected to a rail 104, which is ground potential, via a wheel 103. Electric power supplied from the overhead wire 101 is input to the primary winding of the transformer 106 via the power collecting device 102. Electric power generated in a secondary winding of the transformer 106 is input to the converter 110.

The converter 110 includes circuit units (hereinafter referred to as "legs") in which positive-side arms configured by semiconductor elements UPC and VPC (e.g., in a U phase, UPC) and negative-side arms configured by semiconductor elements UNC and VNC (e.g., in the U phase, UNC) are respectively connected in series. That is, in the converter 110, a single-phase bridge circuit including two sets (for the U phase and for a V phase) of legs is configured.

Note that, as explained below, in general, the semiconductor elements UPC, VPC, UNC, and VNC have a configuration including a switching element and a diode element connected in antiparallel to the switching element.

The converter 110 performs PWM control of the semiconductor elements UPC, VPC, UNC, and VNC to covert an input alternating-current voltage into a desired direct-current voltage and output the direct-current voltage.

The capacitor 120 functioning as a direct-current power supply is connected in parallel and the inverter 130 that receives a direct-current voltage of the capacitor 120 as an input and converts the direct-current voltage into an alternating-current voltage having any voltage and any frequency and outputs the alternating-current voltage is connected to an output end of the converter 110.

The inverter 130 includes legs in which positive-side arms configured by semiconductor elements UPI, VPI, and WPI (e.g., in the U phase, UPI) and negative-side arms configured by semiconductor elements UNI, VNI, and WNI (e.g., in the U phase, UNI) are respectively connected in series. That is, in the inverter 130, a three-phase bridge circuit including three sets (for the U phase, for the V phase, and for a W phase) of legs is configured. Note that, as in the converter 110, in general, the semiconductor elements UPI, VPI, WPI, UNI, VNI, and WNI have a configuration including a switching element and a diode element connected in antiparallel to the switching element.

The inverter 130 performs PWM control of the semiconductor elements UPI, VPI, WPI, UNI, VNI, and WNI to convert an input direct-current voltage into a desired alternating-current voltage and output the alternating-current voltage.

Note that, in FIG. 1, as a suitable example of the power converting apparatus according to the first embodiment, an example is explained in which the power converting apparatus is applied to an electric vehicle of alternating-current input. However, the power converting apparatus can also be applied to an electric vehicle of a direct-current input frequently used in a subway, a suburban electric vehicle, or the like. Note that, because the configuration of the electric vehicle of direct-current input is publicly known, explanation of the configuration is omitted.

Figure 2:
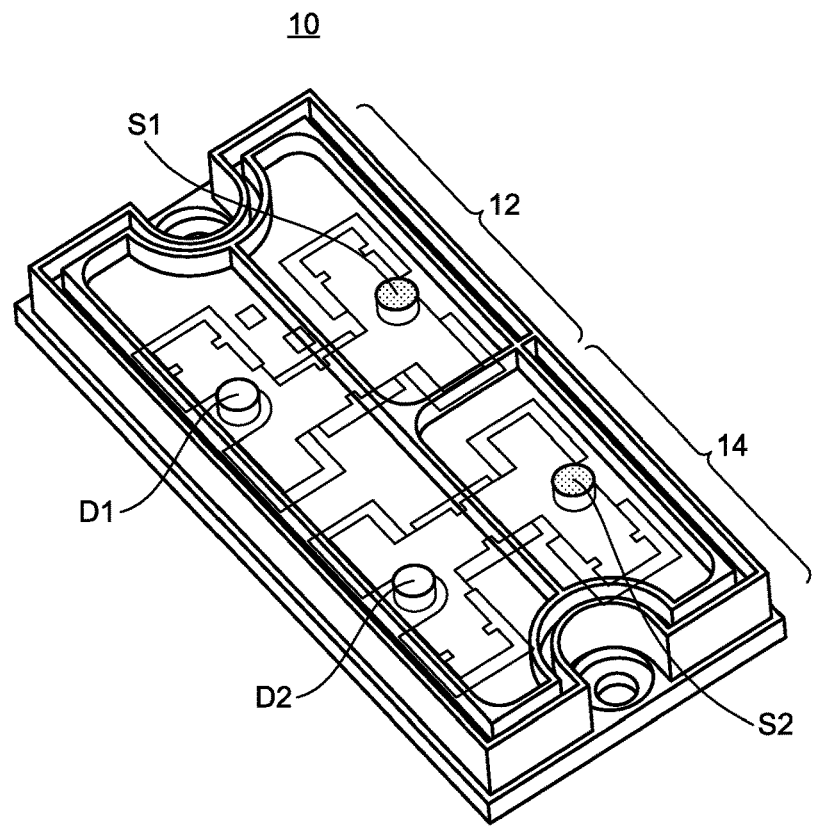
FIG. 2 is a perspective view illustrating a schematic shape of a core module, which is a basic unit in configuring the power semiconductor module according to the embodiment.
Figure 3:
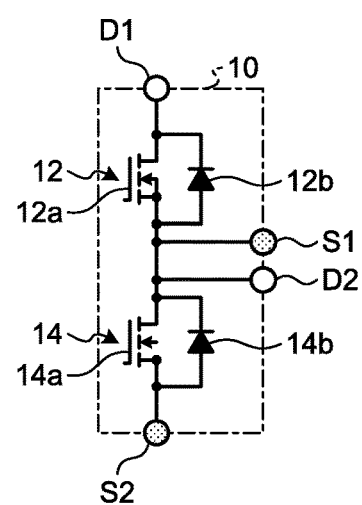
FIG. 3 is a diagram illustrating electric wiring inside the core module illustrated in FIG. 2.

The power semiconductor module according to the first embodiment is explained. FIG. 2 is a perspective view illustrating a schematic shape of a core module, which is a basic unit in configuring the power semiconductor module according to the first embodiment. FIG. 3 is a diagram illustrating electric wiring inside the core module illustrated in FIG. 2.

As illustrated in FIG. 2 and FIG. 3, in a core module 10, which is the basic unit of the power semiconductor module according to the first embodiment, a first element pair 12 formed by connecting a MOS-Field-Effect-Transistor (MOSFET) 12a, which is a Metal-Oxide-Semiconductor (MOS)-type switching element, and a Fly Wheel Diode (hereinafter described as "FWD") 12b in antiparallel and a second element pair 14 formed by connecting a MOSFET 14a and a FWD 14b in antiparallel are sealed by resin and formed. In this way, the core module 10, which is the basic unit, configures a so-called 2-in-1 module in which two element pairs are housed in one module. Note that, in this embodiment, the MOS-type switching element is used as a switching element. However, other power semiconductor switching elements such as an Insulated Gate Bipolar Transistor (IGBT) can also be used.

In the first element pair 12, a drain (a positive-side electrode) of the MOSFET and a cathode of the FWD are connected in the module, a connection end of the drain and the cathode is drawn out to the outer side of a portion sealed by resin to configure a first drain electrode D1 (also referred to as first electrode) in the core module 10, a source (a negative-side electrode) of the MOSFET and an anode of the FWD are connected in the module, and a connection end of the source and the anode is drawn out to the outer side of the portion sealed by resin to configure a first source electrode S1 (also referred to as second electrode) in the core module 10. Similarly, in the second element pair 14, a drain (a positive-side electrode) of the MOSFET and a cathode of the FWD are connected in the module, a connection end of the drain and the cathode is drawn out to the outer side of a portion sealed by resin to configure a second drain electrode D2 (also referred to as third electrode) in the core module 10, and a source (a negative-side electrode) of the MOSFET and an anode of the FWD are connected in the module, and a connection end of the source and the anode is drawn out to the outer side of the portion sealed by resin to configure a second source electrode S2 (also referred to as fourth electrode) in the core module 10. As illustrated in FIG. 2, the first drain electrode D1, the first source electrode S1, the second drain electrode D2, and the second source electrode S2 of the core module 10 are respectively provided to be exposed to the surface of the core module 10 sealed by resin. That is, electrodes corresponding to each of the positive-side electrodes and the negative-side electrodes of the switching element incorporated in the core module 10 and electrically connected to the electrodes are provided on the surface of the core module 10.

FIG. 4C is an exploded perspective view illustrating the exterior configuration of a 500A-rated one-phase module, which is an example of the power semiconductor module according to the first embodiment. The 500A-rated one-phase module illustrated in FIG. 4C is configured by using a cover with terminals 20A illustrated in FIG. 4A and the core module 10 illustrated in FIG. 4B. The cover with terminals 20A has a box-shaped structure opened in a second surface (in an example illustrated in FIGS. 4A to 4C, the bottom surface) opposed to a first surface (in the example illustrated in FIGS. 4A to 4C, the top surface). On the first surface, a positive planar electrode 24P configuring a part of a direct-current positive electrode terminal 22P, a negative planar electrode 24N configuring a part of a direct-current negative electrode terminal 22N, and an alternating-current planar electrode 24AC configuring a part of an alternating-current terminal 22AC are formed. Note that at least one of the positive planar electrode 24P, the negative planar electrode 24N, and the alternating-current planar electrode 24AC can be formed on another surface other than the first surface.

Figure 5:
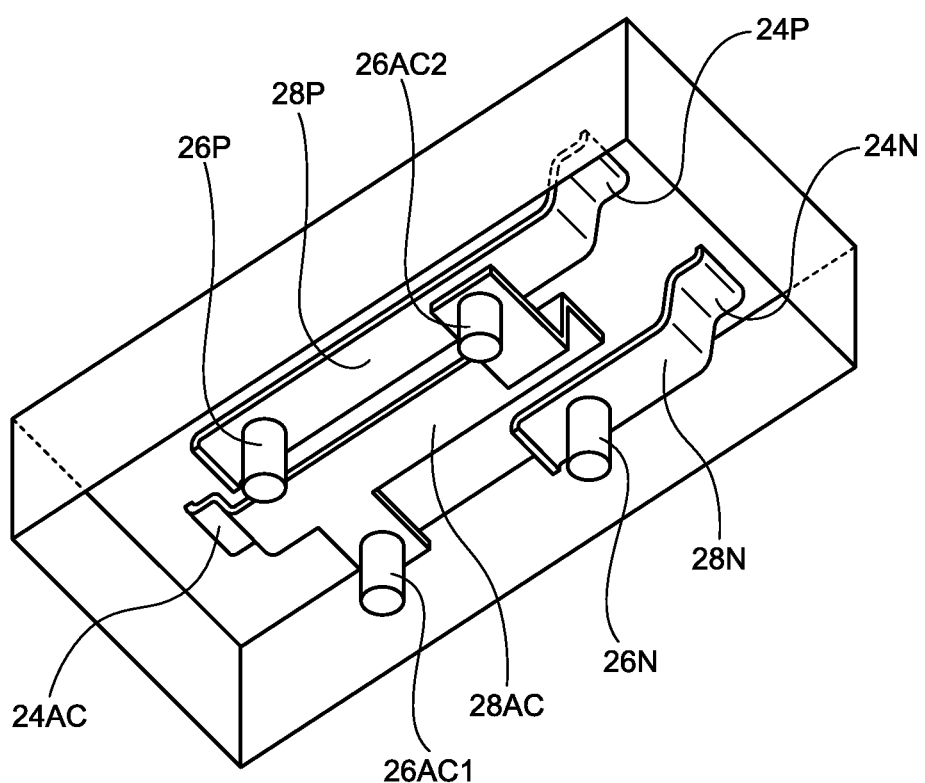
FIG. 5 is a perspective view at the time when a cover with terminals 20A illustrated in FIG. 4A is visually recognized from the rear surface side and the lower side.

FIG. 5 is a perspective view at the time when the cover with terminals 20A illustrated in FIG. 4A is visually recognized from the rear surface side and the lower side. On the inside of the cover with terminals 20A, as illustrated in FIG. 5, a positive projecting electrode 26P, a negative projecting electrode 26N, an alternating-current projecting first electrode 26AC1, and an alternating-current projecting second electrode 26AC2 projecting inward are formed and a positive coupling electrode 28P for electrically connecting the positive projecting electrode 26P and the positive planar electrode 24P, a negative coupling electrode 28N for electrically connecting the negative projecting electrode 26N and a negative planar electrode 24N, and an alternating coupling electrode 28AC for electrically connecting each of the alternating-current projecting first electrode 26AC1 and the alternating-current projecting second electrode 26AC2 and the alternating-current planar electrode 24AC are formed. The positive projecting electrode 26P and the positive coupling electrode 28P configure a part of the direct-current positive electrode terminal 22P. The negative projecting electrode 26P and the negative coupling electrode 28N configure a part of the direct-current negative electrode terminal 22N. The alternating-current projecting first electrode 26AC1, the alternating-current projecting second electrode 26AC2, and the alternating-current coupling electrode 28AC configure a part of the alternating-current terminal 22AC.

In the power semiconductor module according to the first embodiment, when the cover with terminals 20A is put on an upper part of the core module 10, that is, a side where the first and second drain electrodes (D1 and D2) and the first and second source electrodes (S1 and S2) are exposed, the positive projecting electrode 26P formed on the cover with terminals 20A and the first drain electrode D1 come into contact, the negative projecting electrode 26N and the second source electrode S2 come into contact, the alternating-current projecting first electrode 26AC1 and the first source electrode S1 come into contact, and the alternating-current projecting second electrode 26AC2 and the second drain electrode D2 come into contact. Electric wiring between the core module 10 and the cover with terminals 20A is formed by the contact of the electrodes. The 500A-rated one-phase module illustrated in FIG. 4C is obtained.

Figure 6:
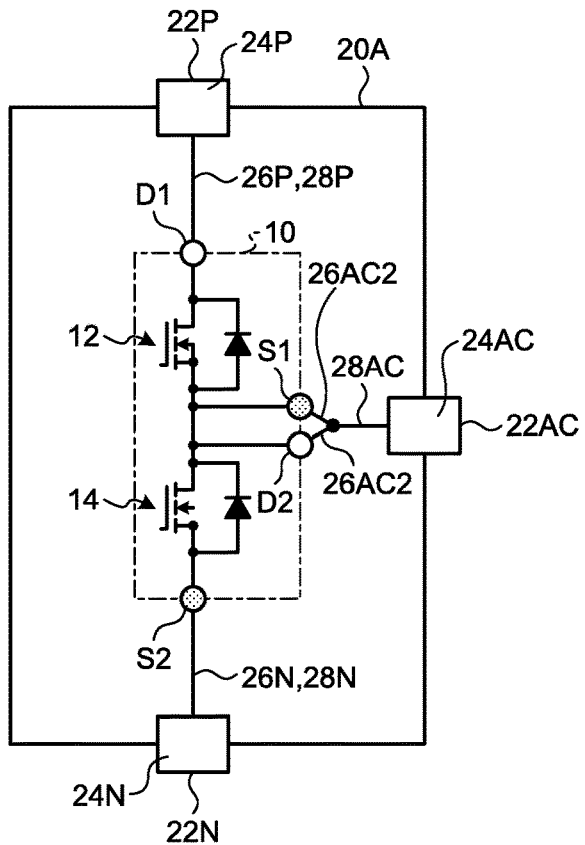
FIG. 6 is a diagram illustrating electric wiring inside a cover with terminals in the 500A-rated one-phase module illustrated in FIGS. 4A to 4C.

FIG. 6 is a diagram illustrating electric wiring inside the cover with terminals 20A in the 500A-rated one-phase module illustrated in FIGS. 4A to 4C. In FIG. 6, a circuit configuration of the core module 10 illustrated in FIG. 3 is illustrated. On the inside of the cover with terminals 20A, the first drain electrode D1 of the core module 10 and the positive planar electrode 24P forming the direct-current positive electrode terminal 22P of the cover with terminals 20A are connected by the positive projecting electrode 26P and the positive coupling electrode 28P and the second source electrode S2 of the core module 10 and the negative planar electrode 24N forming the direct-current negative electrode terminal 22N of the cover with terminals 20A are connected by the negative projecting electrode 26N and the negative coupling electrode 28N. The first source electrode S1 of the core module 10 and the alternating-current projecting first electrode 26AC1 forming the alternating-current terminal 22AC of the cover with terminals 20A are connected and the second drain electrode D2 of the core module 10 and the alternating-current projecting second electrode 26AC2 forming the alternating-current terminal 22AC of the cover with terminals 20A are connected. The first source electrode S1 and the second drain electrode D2 are connected to an alternating-current planar electrode 24AC forming the alternating-current terminal 22AC via the alternating-current coupling electrode 28AC electrically connected to the alternating-current projecting first electrode 26AC1 and the alternating-current projecting second electrode 26AC2. In this way, electric wiring between each of the direct-current positive electrode terminal 22P, the direct-current negative electrode terminal 22N, and the alternating-current terminal 22AC and the first and second drain electrodes (D1 and D2) and first and second source electrodes (S1 and S2) corresponding to the terminal is formed. The core module 10 is configured.

The 500A-rated one-phase module illustrated in FIGS. 4A, 4B, 4C and FIG. 6 can be used in a leg for one phase configuring an inverter circuit or a leg for one phase configuring a converter circuit. For example, in the configuration illustrated in FIG. 1, the inverter 130 can be used in a set of each of the semiconductor elements UPI and UNI, the semiconductor elements VPI and VNI, and the semiconductor elements WPI and WNI. The converter 110 can be used in a set of each of the semiconductor elements UPC and UNC and the semiconductor elements VPC and VNC.

Second Embodiment

Figure 7:
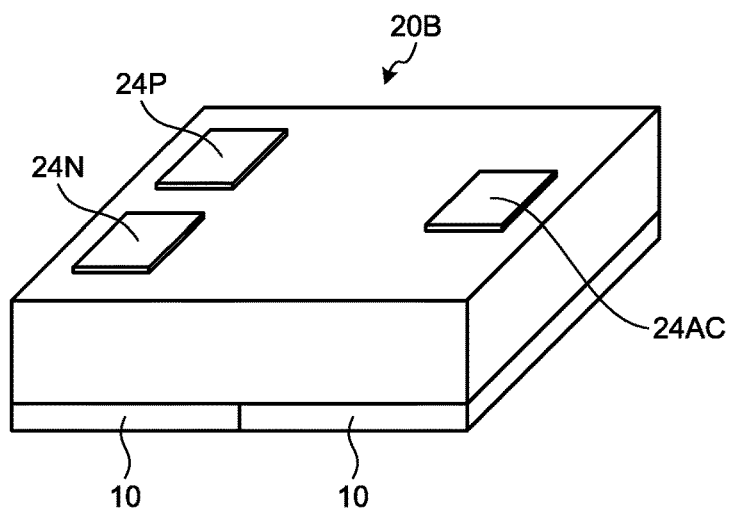
FIG. 7 is a perspective view illustrating the exterior configuration of a 1000A-rated one-phase module, which is an example of a power semiconductor module according to a second embodiment.
Figure 8:
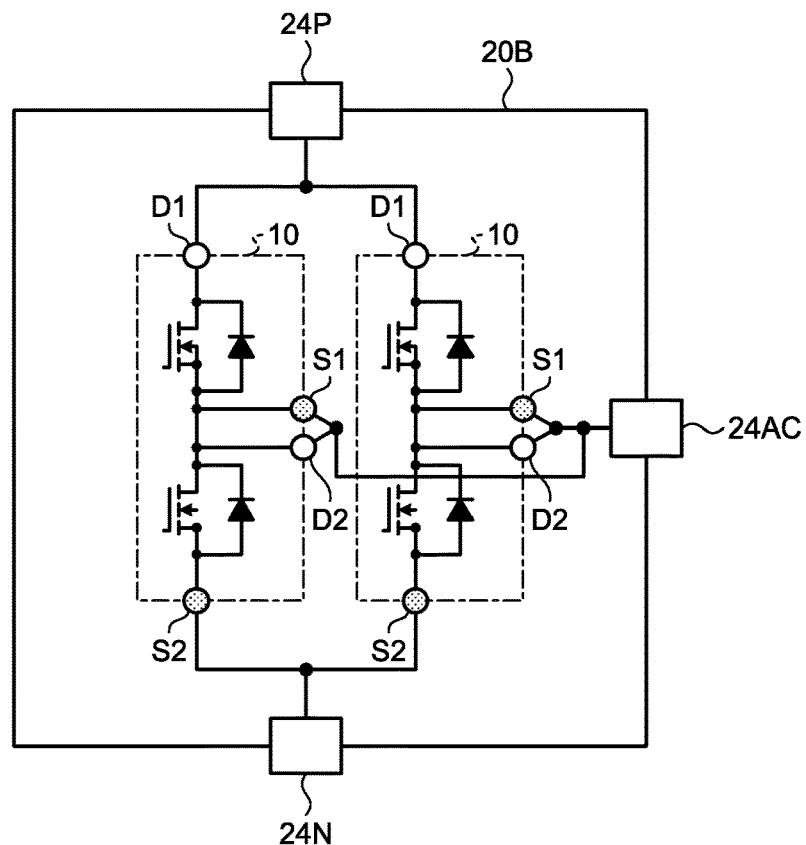
FIG. 8 is a diagram illustrating electric wiring inside a cover with terminals in the 1000A-rated one-phase module illustrated in FIG. 7.

FIG. 7 is a perspective view illustrating the exterior configuration of a 1000A-rated one-phase module, which is an example of a power semiconductor module according to a second embodiment. FIG. 8 is a diagram illustrating electric wiring inside a cover with terminals 20B in the 1000A-rated one-phase module illustrated in FIG. 7.

The 1000A-rated one-phase module is implemented by, as illustrated in FIG. 7, disposing a pair of the core modules 10 illustrated in FIG. 2 side by side and putting the cover with terminals 20B on a side where electrodes are exposed in the two core modules 10. On the inside of the cover with terminals 20B, projecting electrodes and coupling electrodes (hereinafter referred to as "electrode members") same as those in the cover with terminals 20A illustrated in FIG. 5 are configured. The planar electrodes (24P, 24N, and 24AC) and the electrodes (D1, D2, S1, and S2) in the two core modules 10 are electrically connected via the electrode members.

On the inside of the cover with terminals 20B, as illustrated in FIG. 8, the two core modules 10 are connected in parallel. Therefore, a one-phase module having a double capacity, that is, the 1000A-rated one-phase module is configured.

The 1000A-rated one-phase module illustrated in FIG. 7 and FIG. 8 can be used in a positive-side arm and a negative-side arm for one phase configuring an inverter circuit or a positive-side arm and a negative-side arm for one phase configuring a converter circuit. For example, in the configuration illustrated in FIG. 1, the inverter 130 can be used in a set of each of the semiconductor elements UPI and UNI, the semiconductor elements VPI and VNI, and semiconductor elements WPI and WNI. The converter 110 can be used in a set of each of the semiconductor elements UPC and UNC and the semiconductor elements VPC and VNC. In both the configurations, it is possible to secure a current capacity twice as large as a current capacity secured when the 500A-rated one-phase module is used.

Third Embodiment

Figure 9:
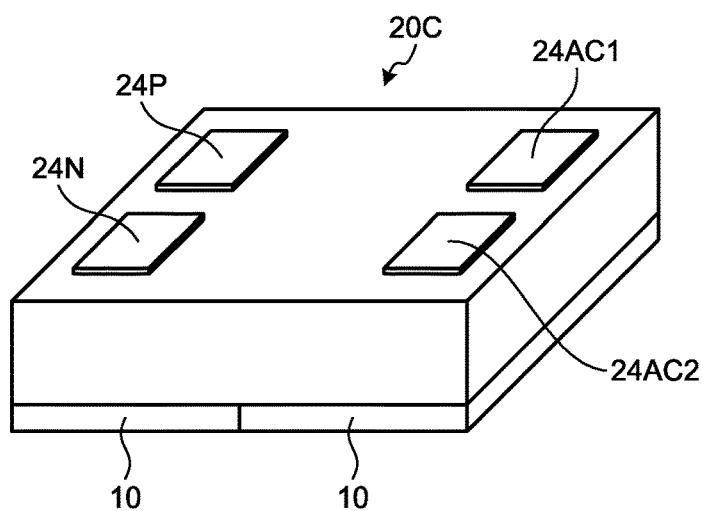
FIG. 9 is a perspective view illustrating the exterior configuration of a 500A-rated single-phase module, which is an example of a power semiconductor module according to a third embodiment.
Figure 10:
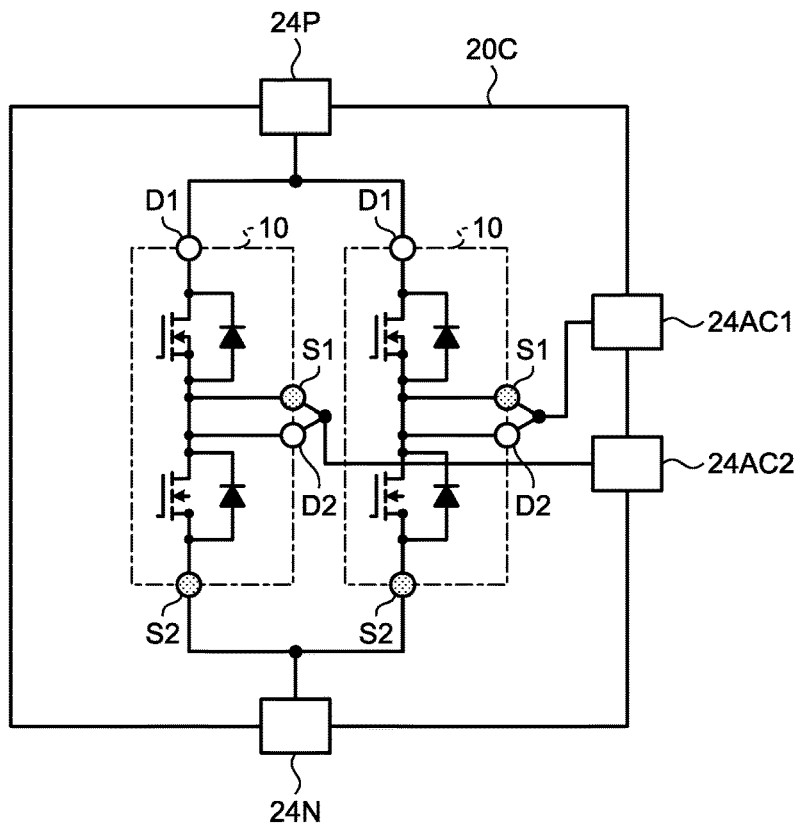
FIG. 10 is a diagram illustrating electric wiring inside a cover with terminals in the 500A-rated single-phase module illustrated in FIG. 9.

FIG. 9 is a perspective view illustrating the exterior configuration of a 500A-rated single-phase module, which is an example of a power semiconductor module according to a third embodiment. FIG. 10 is a diagram illustrating electric wiring inside a cover with terminals 20C in the 500A-rated single-phase module illustrated in FIG. 9.

The 500A-rated single-phase module is implemented by, as illustrated in FIG. 9, disposing a pair of the core modules 10 illustrated in FIG. 2 side by side and putting the cover with terminals 20B on a side where electrodes are exposed in the two core modules 10. On the inside of the cover with terminals 20C, electrode members same as those in the cover with terminals 20A illustrated in FIG. 5 are configured. Planar electrodes (24P, 24N, 24AC1, and 24AC2) and the electrodes (D1, D2, S1, and S2) in the two core modules 10 are electrically connected via the electrode members.

On the inside of the cover with terminals 20C, as illustrated in FIG. 10, the two core modules 10 are connected in parallel and, on the other hand, two alternating-current terminals (S1 and D2) are not electrically connected to each other and are electrically connected to two individual alternating-current terminals (22AC1 and 22AC2) in the cover with terminals 20C. Consequently, the 500A-rated single-phase module in which 500A-rated one-phase modules are connected in parallel is configured.

The 500A-rated single-phase module illustrated in FIG. 9 and FIG. 10 can be used in a bridge circuit configuring a single-phase inverter circuit or a bridge circuit configuring a single-phase converter circuit. For example, the configuration of the power converting apparatus 150 illustrated in FIG. 1 can be directly used in the converter 110.

Fourth Embodiment

Figure 11:
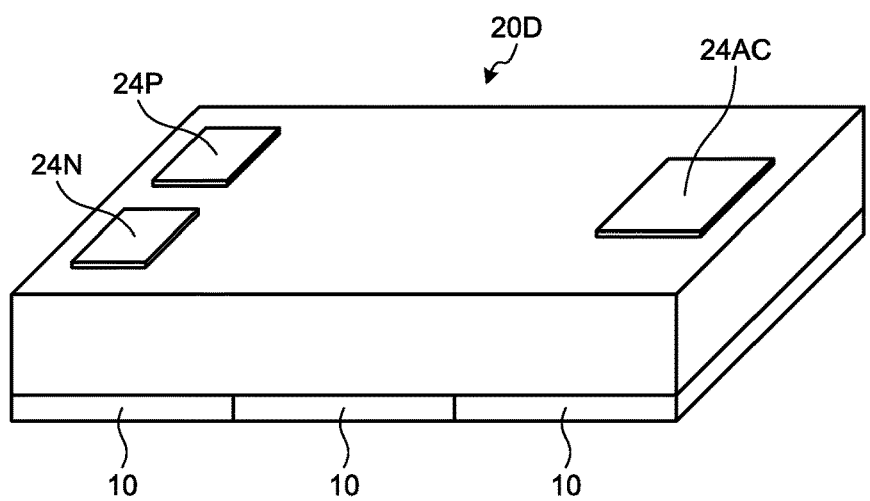
FIG. 11 is a perspective view illustrating the exterior configuration of a 1500A-rated one-phase module, which is an example of a power semiconductor module according to a fourth embodiment.
Figure 12:
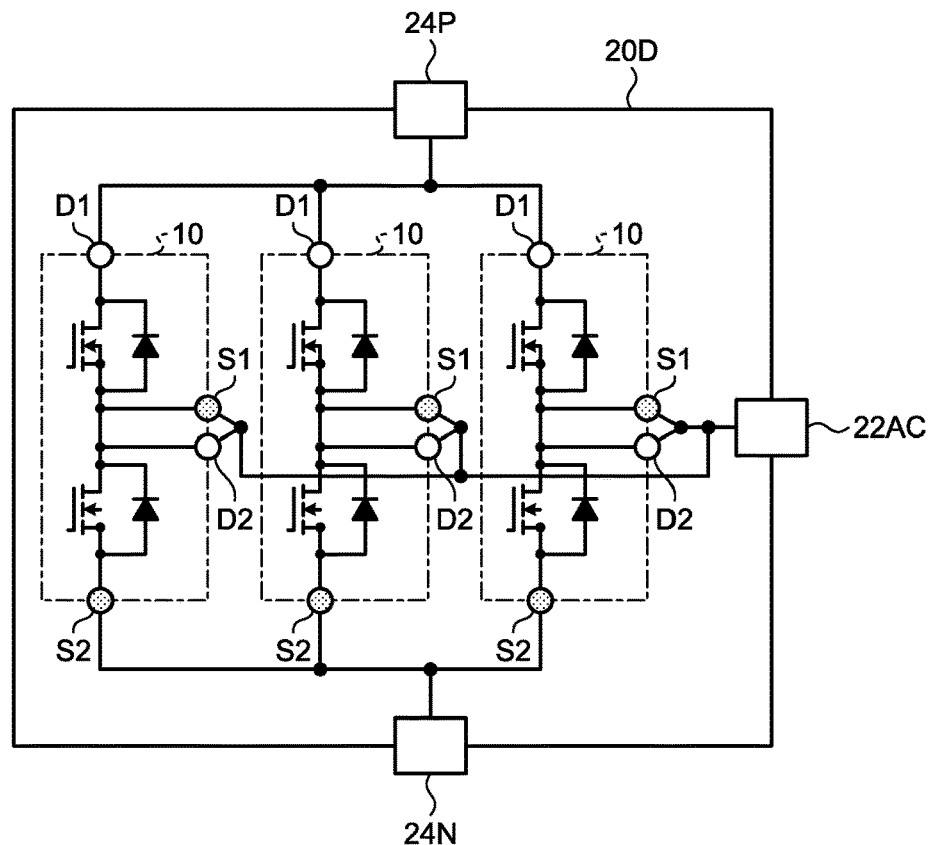
FIG. 12 is a diagram illustrating electric wiring inside a cover with terminals in the 1500A-rated one-phase module illustrated in FIG. 11.

FIG. 11 is a perspective view illustrating the exterior configuration of a 1500A-rated one-phase module, which is an example of a power semiconductor module according to a fourth embodiment. FIG. 12 is a diagram illustrating electric wiring inside a cover with terminals 20D in the 1500A-rated one-phase module illustrated in FIG. 11.

The 1500A-rated one-phase module is implemented by, as illustrated in FIG. 11, disposing a trio of the core modules 10 illustrated in FIG. 2 side by side and putting the cover with terminals 20D on a side where electrodes are exposed in the three core modules 10. On the inside of the cover with terminals 20D, electrode members same as those in the cover with terminals 20A illustrated in FIG. 5 are configured. The planar electrodes (24P, 24N, and 24AC) and the electrodes (D1, D2, S1, and S2) in the three core modules 10 are electrically connected via the electrode members.

On the inside of the cover with terminals 20D, as illustrated in FIG. 12, the three core modules 10 are connected in parallel. Therefore, a one-phase module having a triple capacity, that is, the 1500A-rated one-phase module is configured.

The 1500A-rated one-phase module illustrated in FIG. 11 and FIG. 12 can be used in a leg for each one phase configuring an inverter circuit or a leg for one phase configuring the converter circuit. For example, in the configuration illustrated in FIG. 1, the inverter 130 can be used in a set of each of the semiconductor elements UPI and UNI, the semiconductor elements VPI and VNI, and the semiconductor elements WPI and WNI. The converter 110 can be used in a set of each of the semiconductor elements UPC and UNC and the semiconductor elements VPC and VNC. In all the configurations, it is possible to secure a current capacity three times as large as a current capacity secured when the 500A-rated one-phase module is used.

Fifth Embodiment

Figure 13:
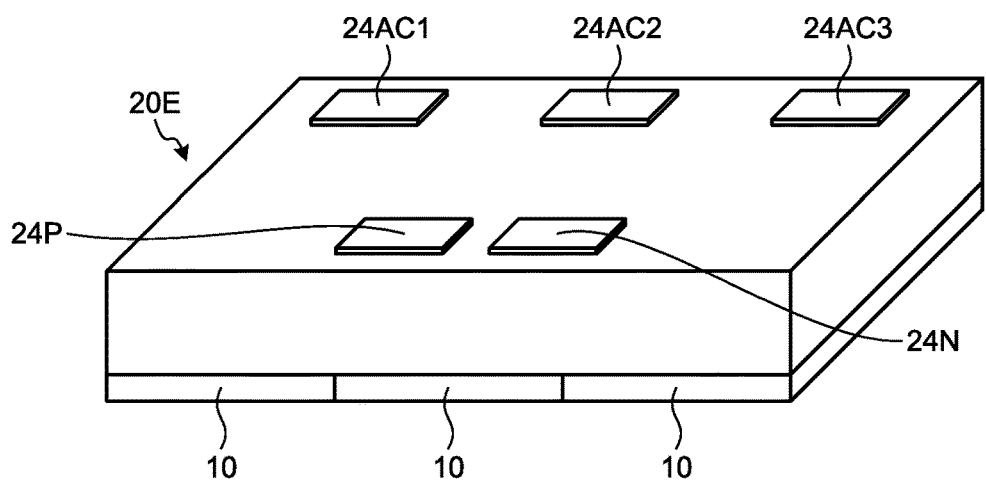
FIG. 13 is a perspective view illustrating the exterior configuration of a 500A-rated three-phase module, which is an example of a power semiconductor module according to a fifth embodiment.
Figure 14:
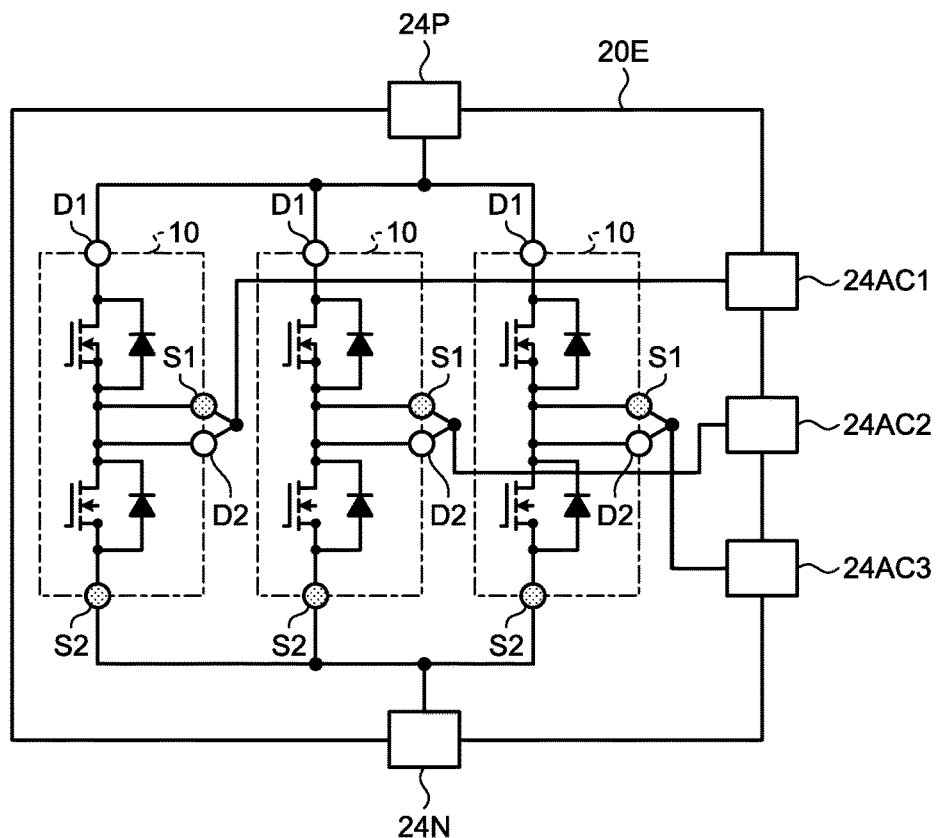
FIG. 14 is a diagram illustrating electric wiring inside a cover with terminals in the 500A-rated three-phase module illustrated in FIG. 13.

FIG. 13 is a perspective view illustrating the exterior configuration of a 500A-rated three-phase module, which is an example of a power semiconductor module according to a fifth embodiment. FIG. 14 is a diagram illustrating electric wiring inside a cover with terminals 20E in the 500A-rated three-phase module illustrated in FIG. 13.

The 500A-rated three-phase module is implemented by, as illustrated in FIG. 13, disposing a trio of the core modules 10 illustrated in FIG. 2 side by side and putting the cover with terminals 20E on a side where electrodes are exposed in the three core modules 10. On the inside of the cover with terminals 20E, electrode members same as those in the cover with terminals 20A illustrated in FIG. 5 are configured. Planar electrodes (24P, 24N, 24AC1, 24AC2, and 24AC3)

and the electrodes (D1, D2, S1, and S2) in the three core modules 10 are electrically connected via the electrode members.

On the inside of the cover with terminals 20E, as illustrated in FIG. 14, the three core modules 10 are connected in parallel and, on the other hand, three alternating-current terminals (S1 and D2) are not electrically connected to one another and are electrically connected to three individual alternating-current terminals (24AC1, 24AC2, and 24AC3) in the cover with terminals 20E. Consequently, the 500A-rated three-phase module in which three 500A-rated one-phase modules are connected in parallel is configured.

The 500A-rated three-phase module illustrated in FIG. 13 and FIG. 14 can be used in a bridge circuit configuring a three-phase inverter circuit or a bridge circuit configuring a three-phase converter circuit. For example, the configuration of the power converting apparatus 150 illustrated in FIG. 1 can be directly used in the inverter 130.

All of the power semiconductor modules explained above are application examples to a two-level circuit. However, in the following examples, application examples to a three-level circuit are explained.

Sixth Embodiment

Figure 15:
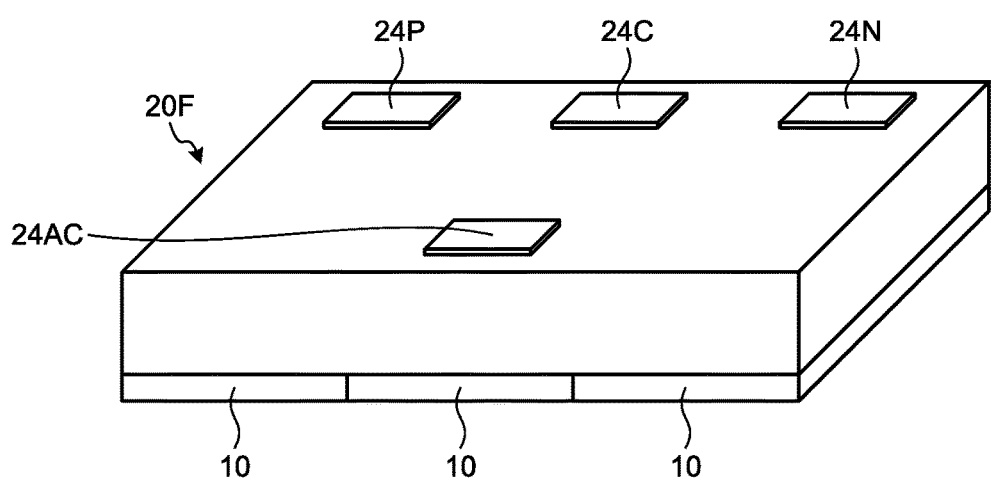
FIG. 15 is a perspective view illustrating the exterior configuration of a 500A-rated one-phase three-level module, which is an example of a power semiconductor module according to a sixth embodiment.
Figure 16:
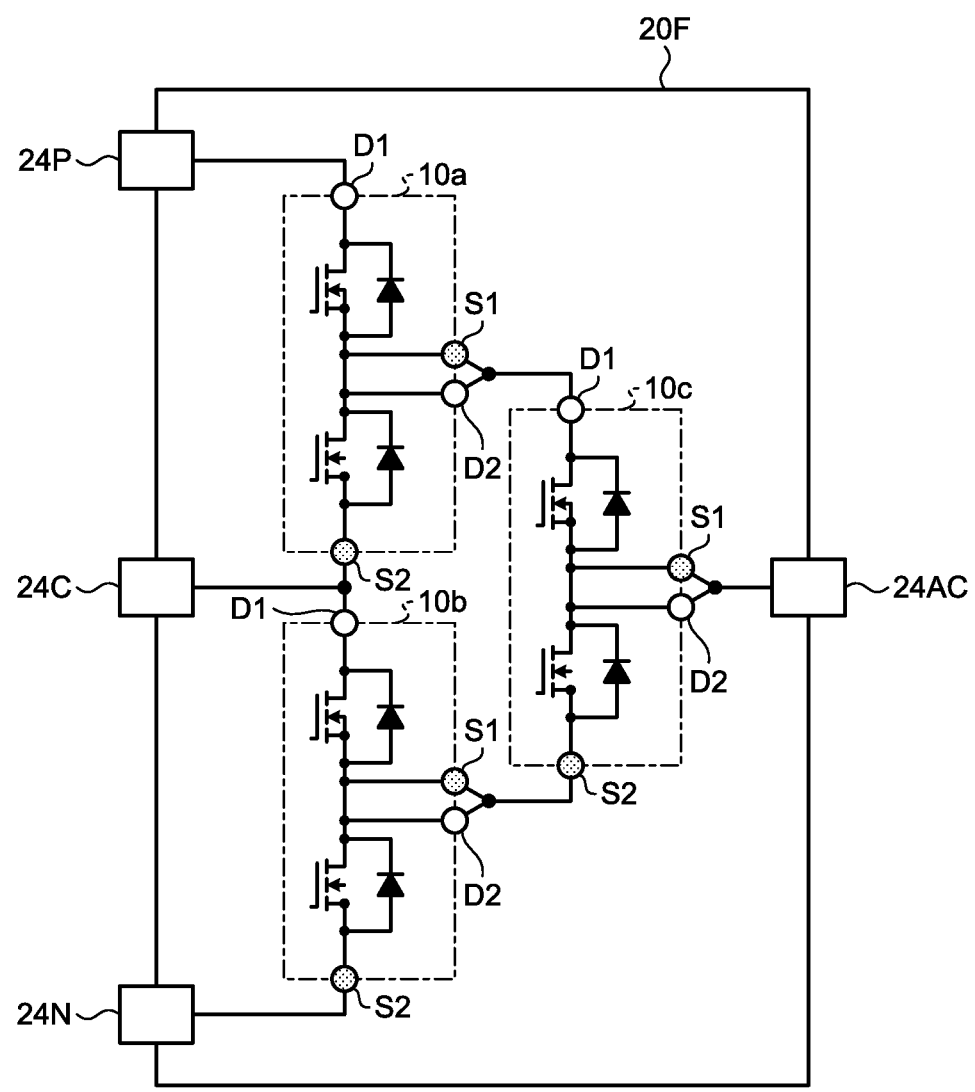
FIG. 16 is a diagram illustrating electric wiring inside a cover with terminals in the 500A-rated one-phase three-level module illustrated in FIG. 15.

FIG. 15 is a perspective view illustrating the exterior configuration of a 500A-rated one-phase three-level module, which is an example of a power semiconductor module according to a sixth embodiment. FIG. 16 is a diagram illustrating electric wiring inside a cover with terminals 20F in the 500A-rated one-phase three-level module illustrated in FIG. 15. Note that, in FIG. 16, for convenience, three core modules 10 are distinguished by adding suffices "a", "b", and "c" thereto.

The 500A-rated one-phase three-level module is implemented by, as illustrated in FIG. 15, disposing a trio of the core modules 10 illustrated in FIG. 2 side by side and putting the cover with terminals 20F on a side where electrodes are exposed in the three core modules 10. On the inside of the cover with terminals 20F, electrode members same as those in the cover with terminals 20A illustrated in FIG. 5 are configured. Planar electrodes (24P, 24C, 24N, and 24AC) and the electrodes (D1, D2, S1, and S2) in the three core modules 10 are electrically connected via the electrode members. Note that the planar electrode 24C is an electrode configuring a part of a direct-current midpoint terminal 22C.

On the inside of the cover with terminals 20F, as illustrated in FIG. 16, the first drain electrode D1 of a first core module 10a among the three core modules 10 and a direct-current positive electrode terminal 22P of the cover with terminals 20F are electrically connected, the second source electrode S2 of the first core module 10a, the first drain electrode D1 of a second core module 10b, and the direct-current midpoint terminal 22C are electrically connected, the second source electrode S2 of the second core module 10b and a direct-current negative electrode terminal 22N of the cover with terminals 20F are electrically connected, and the first source electrode S1 of a third core module 10c, the second drain electrode D2 of the third core module 10c, and the alternating-current terminal 22AC are electrically connected. Among the three core modules, the first source electrode S1 of the first core module 10a, the second drain electrode D2 of the first core module 10a, and the first drain electrode D1 of the third core module 10c are connected and the first source electrode S1 of the second core module 10b, the second drain electrode D2 of the second core module 10b, and the second source electrode S2 of the third core module 10c are connected by electrode members formed to electrically connect the electrodes. By the connection of the electrodes, the 500A-rated one-phase three level module in which three 500A-rated one-phase modules are used is configured.

The 500A-rated one-phase three-level module illustrated in FIG. 15 and FIG. 16 can be used in a leg for each one phase configuring a three-level inverter circuit and a leg for one phase configuring a three-level converter circuit.

The power semiconductor module explained above is an example in which the two or three core modules 10, which are basic units, are used. However, a power semiconductor module can be configured using four or more core modules 10. An example in which a power semiconductor module is configured using four core modules 10 is explained below.

Seventh Embodiment

Figure 17:
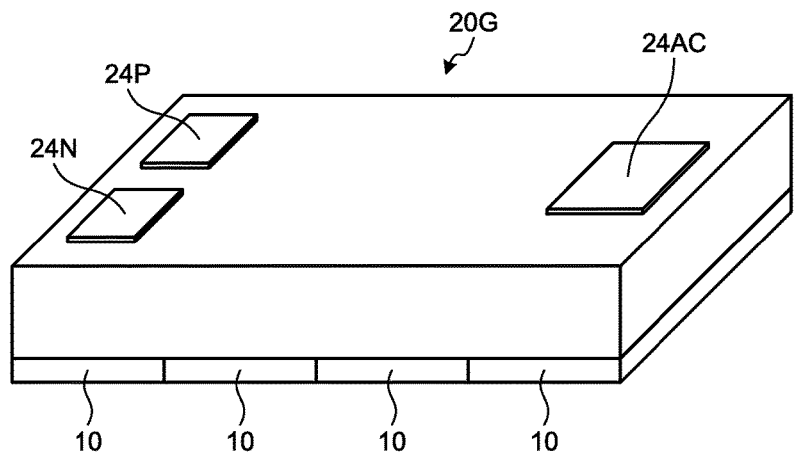
FIG. 17 is a perspective view illustrating the exterior configuration of a 2000A-rated one-phase module, which is an example of a power semiconductor module according to a seventh embodiment.
Figure 18:
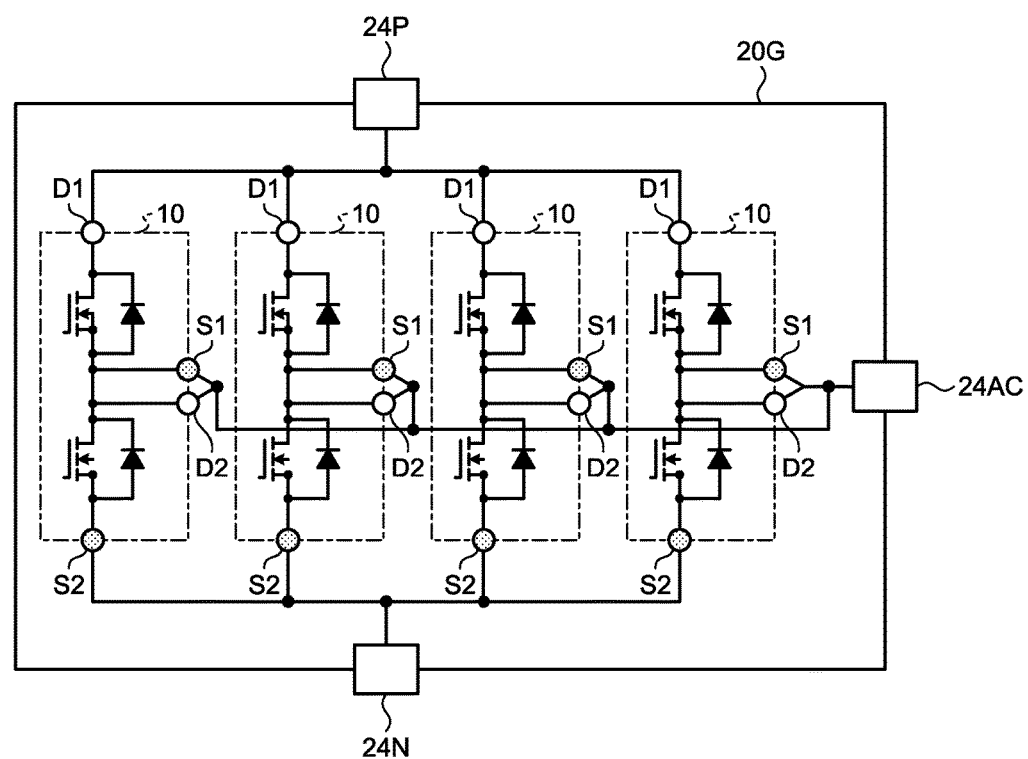
FIG. 18 is a diagram illustrating electric wiring inside a cover with terminals in the 2000A-rated one-phase module illustrated in FIG. 17.

FIG. 17 is a perspective view illustrating the exterior configuration of a 2000A-rated one-phase module, which is an example of a power semiconductor module according to a seventh embodiment. FIG. 18 is a diagram illustrating electric wiring inside a cover with terminals 20G in the 2000A-rated one-phase module illustrated in FIG. 17.

The 2000A-rated one-phase module is implemented by, as illustrated in FIG. 17, disposing a quartet of the core modules 10 illustrated in FIG. 2 side by side and putting the cover with terminals 20G on a side where electrodes are exposed in the four core modules 10. On the inside of the cover with terminals 20G, electrode members same as those in the cover with terminals 20A illustrated in FIG. 5 are configured. The planar electrodes (24P, 24N, and 24AC) and the electrodes (D1, D2, S1, and S2) in the four core modules 10 are electrically connected via the electrode members.

On the inside of the cover with terminals 20G, as illustrated in FIG. 18, the four core modules 10 are connected in parallel. Therefore, a one-phase module having a quadruple capacity, that is, the 2000A-rated one-phase module is configured.

The 2000A-rated one-phase module illustrated in FIG. 17 and FIG. 18 can be used in a leg for each one phase configuring an inverter circuit or a leg for one phase configuring the converter circuit. For example, in the configuration illustrated in FIG. 1, the inverter 130 can be used in a set of each of the semiconductor elements UPI and UNI, the semiconductor elements VPI and VNI, and the semiconductor elements WPI and WNI. The converter 110 can be used in a set of each of the semiconductor elements UPC and UNC and the semiconductor elements VPC and VNC. In all the configurations, it is possible to secure a current capacity four times as large as a current capacity secured when the 500A-rated one-phase module is used.

Eighth Embodiment

Figure 19:
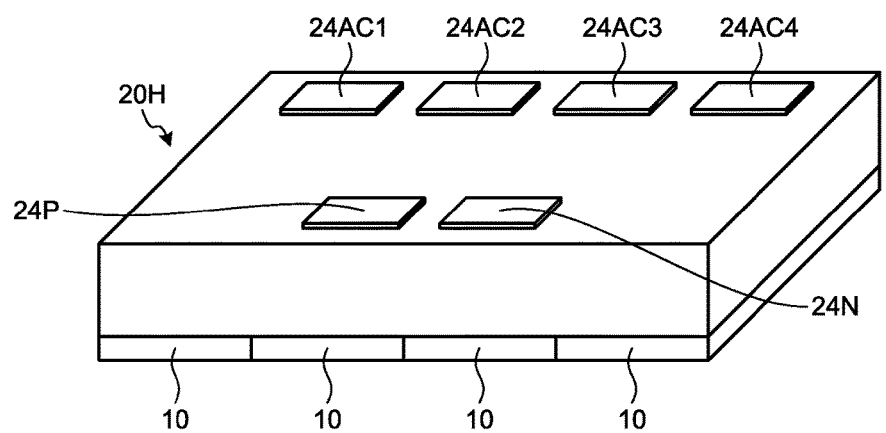
FIG. 19 is a perspective view illustrating the exterior configuration of a composite module, which is an example of a power semiconductor module according to an eighth embodiment.
Figure 20:
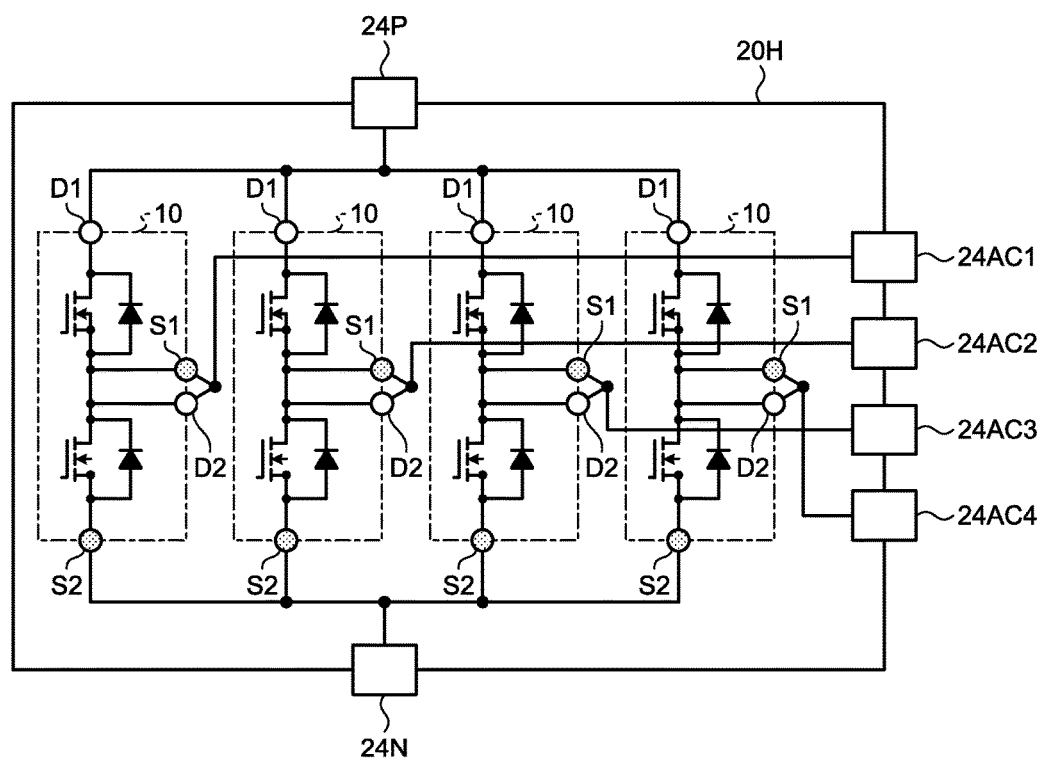
FIG. 20 is a diagram illustrating electric wiring inside a cover with terminals in the composite module illustrated in FIG. 19.

FIG. 19 is a perspective view illustrating the exterior configuration of a composite module, which is an example of a power semiconductor module according to an eighth embodiment. FIG. 20 is a diagram illustrating electric wiring inside a cover with terminals 20H in the composite module illustrated in FIG. 19.

The composite module illustrated in FIG. 20 is implemented by disposing a quartet of the core modules 10 illustrated in FIG. 2 side by side and putting the cover with terminals 20H on a side where electrodes are exposed in the four core modules 10. On the inside of the cover with terminals 20H, electrode members same as those in the cover with terminals 20A illustrated in FIG. 5 are configured. The planar electrodes (24P, 24N, and 24AC) and the electrodes (D1, D2, S1, and S2) in the four core modules 10 are electrically connected via the electrode members.

On the inside of the cover with terminals 20H, as illustrated in FIG. 20, the four core modules 10 are connected in parallel and, on the other hand, four alternating-current terminals (S1 and D2) are not electrically connected to one another and are electrically connected to four individual alternating-current terminals ((24AC1, 24AC2, 24AC3, and 24AC4) in the cover with terminals 20H. Consequently, the composite module in which four 500A-rated one-phase modules are connected in parallel is configured.

In the composite module illustrated in FIG. 19 and FIG. 20, a circuit configured by any three core modules 10 among the four core modules 10 can be used as a 500A-rated three-phase inverter circuit. The remaining one core module 10 can be used as, for example, a chopper circuit.

As explained above, with the power semiconductor module according to this embodiment, the power semiconductor module is configured by the core module 10, on the surface of which the electrodes respectively connected to the positive-side electrode and the negative-side electrode of the switching element of the first element pair and the positive-side electrode and the negative-side electrode of the switching element of the second element pair are exposed, and the cover with terminals 20 in which the electrodes of the core module 10 are internally wired and drawn out as module terminals according to each use. Consequently, it is possible to configure an optimum power semiconductor module corresponding to a current capacity and a two-level or three-level use simply by manufacturing a cover with terminals adapted to each use and changing the number of common core modules 10. Therefore, versatility is high and manufacturing cost can be reduced.

With the power semiconductor module according to this embodiment, various power conversion modules including the 500A-rated one-phase module, the 1000A-rated one-phase module, the 500A-rated single-phase module, the 1500A-rated one-phase module, the 500A-rated three-phase module, the 500A-rated one-phase three-level module, the 2000A-rated one-phase module, and the composite module (a 500A-rated three-phase+ chopper circuit) can be configured by changing electric wiring on the inside of the cover with terminals using one or a plurality of core modules. Therefore, it is possible to reduce the manufacturing cost of the power converting apparatus and reduce the size of the power converting apparatus.

Note that, in this embodiment, the example is explained in which a rated current of one core module is 500 amperes. However, the rated current is not limited to 500 amperes. For example, a module having any rated current can be formed by changing the size of the core module.

As the material of the MOSFET and the FWD configuring the core module 10, for example, silicon (hereinafter described as "Si") or silicon carbide (hereinafter described as "SiC") can be used. In particular, the SiC has a characteristic that the SiC can be used at high temperature. Therefore, it is possible to increase an allowable operating temperature of a module to temperature higher than an allowable operating temperature in the case of the Si. Therefore, it is possible to further reduce a chip occupied area in each element pair. It is possible to further reduce a module size.

In the case of the SiC, because chip thickness can also be reduced, there is also an advantage that heat resistance decreases. Further, when the SiC is used as the FWD, an ON voltage can be reduced. Therefore, an effect that it is possible to greatly reduce a recovery loss is also obtained. Therefore, even if a chip size is reduced, it is possible to reduce a loss while preventing a temperature rise.

Note that the SiC is an example of a semiconductor called a wide bandgap semiconductor. Besides the SiC, for example, a semiconductor formed using a gallium nitride-based material or diamond also belongs to the wide bandgap semiconductor. Therefore, a configuration in which the wide bandgap semiconductor other than the SiC is used also constitute the gist of the present invention.

In this embodiment, the application to the power converting apparatus for the railroad vehicle is explained. However, inverter circuits and converter circuits having the same configurations are used in power converting apparatuses used for an industrial machine use, an electric automobile use, a hybrid car use, a power conditioner use, and the like. Therefore, it goes without saying that the present invention is applicable to a large number of these applications.

Further, in this embodiment, the application of the present invention to the AC-DC converter, the single-phase inverter, or the three-phase inverter is explained as the example. However, it is also possible to apply the present invention to other power converting apparatuses such as a step-up chopper circuit or a step-down chopper circuit.

REFERENCE SIGNS LIST 10 core module; 12 first element pair; 14 second element pair; 12a, 14a MOSFET; 12b, 14b FWD; 16a, 16b, 16c, 16d conductor wire; 20A, 20B, 20C, 20d, 20E, 20F, 20G, 20H cover with terminals; 22P direct-current positive electrode terminal; 22N direct-current negative electrode terminal; 22C direct-current midpoint terminal; 22AC alternating-current terminal; 24AC1 first alternating-current terminal; 24AC2 second alternating-current terminal; 24AC3 third alternating-current terminal; 24AC4 fourth alternating-current terminal; 24P positive planar electrode; 28P positive coupling electrode; 24N negative planar electrode; 26P positive projecting electrode; 26N negative projecting electrode; 26AC1 alternating-current projecting first electrode; 26AC2 alternating-current projecting second electrode; 28N negative coupling electrode; 24AC alternating-current planar electrode; 28AC alternating-current coupling electrode; 100 railroad vehicle; 101 overhead wire; 102 power collecting device; 103 wheel; 104 rail; 106 transformer; 110 converter; 120 capacitor; 130 inverter; 140 electric motor; 150 power converting apparatus; D1 first drain electrode; D2 second drain electrode; S1 first source electrode; S2 second source electrode; UNC, VNC, UNI, VNI, WNI, UPC, VPC, UPI, VPI, WPI semiconductor element.

The invention claimed is:

1. A power semiconductor module comprising:
a core module in which a first element pair formed by connecting a diode element and a switching element in antiparallel and a second element pair formed by connecting a diode element and a switching element in antiparallel are connected in series and the first element pair and the second element pair are sealed by resin; and
a cover with terminals including a direct-current positive electrode terminal, a direct-current negative electrode terminal, and an alternating-current terminal, wherein in the core module, a first electrode electrically connected to a positive-side electrode of the switching element configuring the first element pair, a second electrode electrically connected to a negative-side electrode of the switching element configuring the first element pair, a third electrode electrically connected to a positive-side electrode of the switching element configuring the second element pair, and a fourth electrode electrically connected to a negative-side electrode of the switching element configuring the second element pair are exposed to a surface, the direct-current positive electrode terminal of the cover with terminals is electrically connected to the first electrode, the direct-current negative-electrode terminal of the cover with terminals is electrically connected to the fourth electrode, and the alternating-current terminal of the cover with terminals is electrically connected to the second electrode and the third electrode.

2. The power semiconductor module according to claim 1, wherein the power semiconductor module includes a plurality of the core modules, the first electrodes in the plurality of core modules are electrically connected by the cover with terminals;

the second electrodes and the third electrodes in the plurality of core modules are respectively electrically connected by the cover with terminals, and the fourth electrodes in the plurality of core modules are electrically connected by the cover with terminals.

3. The power semiconductor module according to claim 1, wherein the power semiconductor module includes a plurality of the core modules, the alternating-current terminals as many as a number of the core modules are provided on the cover with terminals to correspond to each of the core modules, and the second electrode and the third electrode of the core module are electrically connected by the alternating-current terminal corresponding to the second electrode and the third electrode among a plurality of the alternating-current terminals.

4. The power semiconductor module according to claim 2, wherein the power semiconductor module includes a pair of the core modules, and the first electrodes and the fourth electrodes in the two core modules are respectively connected in parallel on an inside of the cover with terminals, and the second electrodes and the third electrodes in the two core modules are respectively connected to the alternating-current terminal.

5. The power semiconductor module according to claim 3, wherein the power semiconductor module includes a pair of the core modules, the alternating-current terminal of the cover with terminals includes a first alternating-current terminal and a second alternating-current terminal, and the first electrodes and the fourth electrodes in the two core modules are respectively connected in parallel on an inside of the cover with terminals, the second electrode and the third electrode of one module is connected to the first alternating-current terminal, and the second electrode and the third electrode of a remaining one module are connected to the second alternating-current terminal.

6. The power semiconductor module according to claim 2, wherein the power semiconductor module includes a trio of the core modules, and the first electrodes, the fourth electrodes, and the second electrodes or the third electrodes in the three core modules are respectively connected in parallel on an inside of the cover with terminals.

7. The power semiconductor module according to claim 3, wherein the power semiconductor module includes a trio of the core modules, and the alternating-current terminal of the cover with terminals includes a first alternating-current terminal, a second alternating-current terminal, and a third alternating-current terminal and the first electrodes and the fourth electrodes in the three core modules are respectively connected in parallel on an inside of the cover with terminals, the second electrode and the third electrode of one module are connected to the first alternating-current terminal, the second electrode and the third electrode of another one module are connected to the second alternating-current terminal, and the second electrode and the third electrode of remaining one module are connected to the third alternating-current terminal.

8. The power semiconductor module according to claim 2, wherein the power semiconductor module includes a quartet of the core modules, and the first electrodes, the fourth electrodes, and the second electrodes or the third electrodes in the four core modules are respectively connected in parallel on an inside of the cover with terminals.

9. The power semiconductor module according to claim 3, wherein the power semiconductor module includes a quartet of the core modules, and the alternating-current terminal of the cover with terminals includes a first alternating-current terminal, a second alternating-current terminal, a third alternating-current terminal, and a fourth alternating-current terminal, the first electrodes and the fourth electrodes in the four core modules are respectively connected in parallel on an inside of the cover with terminals, the second electrode and the third electrode of one module are connected to the first alternating-current terminal, the second electrode and the third electrode of another one module are connected to the second alternating-current terminal, the second electrode and the third electrode of another one module are connected to the third alternating-current terminal, and the second electrode and the third electrode of remaining one module are connected to the fourth alternating-current terminal.

10. The power semiconductor module according to claim 2, wherein the power semiconductor module includes a plurality of the core modules, the alternating-current terminals as many as a number of the core modules are provided on the cover with terminals to correspond to each of the core modules, and the second electrode and the third electrode of the core module are electrically connected by the alternating-current terminal corresponding to the second electrode and the third electrode among a plurality of the alternating-current terminals.

11. The power semiconductor module according to claim 10, wherein
the power semiconductor module includes a pair of the core modules,
the alternating-current terminal of the cover with terminals includes a first alternating-current terminal and a second alternating-current terminal, and
the first electrodes and the fourth electrodes in the two core modules are respectively connected in parallel on an inside of the cover with terminals, the second electrode and the third electrode of one module is connected to the first alternating-current terminal, and the second electrode and the third electrode of a remaining one module are connected to the second alternating-current terminal.

12. The power semiconductor module according to claim 10, wherein
the power semiconductor module includes a trio of the core modules, and
the alternating-current terminal of the cover with terminals includes a first alternating-current terminal, a second alternating-current terminal, and a third alternating-current terminal and the first electrodes and the fourth electrodes in the three core modules are respectively connected in parallel on an inside of the cover with terminals, the second electrode and the third electrode of one module are connected to the first alternating-current terminal, the second electrode and the third electrode of another one module are connected to the second alternating-current terminal, and the second electrode and the third electrode of remaining one module are connected to the third alternating-current terminal.

13. The power semiconductor module according to claim 10, wherein
the power semiconductor module includes a quartet of the core modules, and
the alternating-current terminal of the cover with terminals includes a first alternating-current terminal, a second alternating-current terminal, a third alternating-current terminal, and a fourth alternating-current terminal, the first electrodes and the fourth electrodes in the four core modules are respectively connected in parallel on an inside of the cover with terminals, the second electrode and the third electrode of one module are connected to the first alternating-current terminal, the second electrode and the third electrode of another one module are connected to the second alternating-current terminal, the second electrode and the third electrode of another one module are connected to the third alternating-current terminal, and the second electrode and the third electrode of remaining one module are connected to the fourth alternating-current terminal.

14. A power semiconductor module comprising:
at least three core modules in which first element pairs formed by connecting diode elements and switching elements in antiparallel and second element pairs formed by connecting diode elements and switching elements in antiparallel are connected in series and the first element pairs and the second element pairs are sealed by resin; and
a cover with terminals including a direct-current positive electrode terminal, a direct-current negative electrode terminal, a direct-current midpoint terminal, and an alternating-current terminal, wherein
in the core modules, first electrodes electrically connected to positive-side electrodes of the switching elements configuring the first element pairs, second electrodes electrically connected to negative-side electrodes of the switching elements configuring the first element pairs, third electrodes electrically connected to positive-side electrodes of the switching elements configuring the second element pairs, and fourth electrodes electrically connected to negative-side electrodes of the switching elements configuring the second element pairs are exposed to a surface,
the direct-current positive electrode terminal of the cover with terminals is electrically connected to the first electrode provided in a first core module among the at least three core modules,
the direct-current negative-electrode terminal of the cover with terminals is electrically connected to the fourth electrode provided in a second core module among the at least three core modules,
the direct-current midpoint terminal of the cover with terminals is electrically connected to the fourth electrode provided in the first core module and the first electrode provided in the second core module, and
the alternating-current terminal of the cover with terminals is electrically connected to the second electrode and the third electrode provided in a third core module among the at least three core modules.

15. The power semiconductor module according to claim 14, wherein
the power semiconductor module includes a trio of the core modules,
the direct-current midpoint terminal is formed on the cover with terminals,
the first electrode of the first core module and the direct-current positive electrode terminal of the cover with terminals are connected, an electric connection point of the fourth electrode of the first core module and the first electrode of the second core module and the direct-current midpoint terminal are connected, the fourth electrode of the second core module and the direct-current negative electrode terminal are connected, and an electric connection point of the second electrode of the third core module and the third electrode of the third core module and the alternating-current terminal among the three core modules are connected, and
either the second electrode of the first core module or the third electrode of the first core module and the first electrode of the third core module are connected, and either the second electrode of the second core module or the third electrode of the second core module and the fourth electrode of the third core module are connected.

* * * * *